US009190106B2

(12) United States Patent
Zhang et al.

(10) Patent No.: US 9,190,106 B2
(45) Date of Patent: Nov. 17, 2015

(54) METHOD OF PROCESSING ADDRESS INFORMATION FOR A DATA STORAGE DEVICE, AND STORAGE MEDIUM, MODULATOR, DEMODULATOR, AND DATA STORAGE DEVICE

(71) Applicant: MARVELL INTERNATIONAL LTD., Hamilton (BM)

(72) Inventors: Song Hua Zhang, Singapore (SG); Moulay Rachid Elidrissi, Singapore (SG); Kheong Sann Chan, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/358,646

(22) PCT Filed: Nov. 21, 2012

(86) PCT No.: PCT/SG2012/000436
§ 371 (c)(1),
(2) Date: May 15, 2014

(87) PCT Pub. No.: WO2013/077810
PCT Pub. Date: May 30, 2013

(65) Prior Publication Data
US 2014/0300985 A1  Oct. 9, 2014

(30) Foreign Application Priority Data
Nov. 21, 2011  (SG) .............................. 201108620-4

(51) Int. Cl.
*G11B 7/24* (2013.01)
*G11B 20/20* (2006.01)
(Continued)

(52) U.S. Cl.
CPC ...... *G11B 20/1217* (2013.01); *G11B 20/10009* (2013.01); *G11B 20/10268* (2013.01);
(Continued)

(58) Field of Classification Search
CPC .... G11B 27/3027; G11B 27/24; G11B 19/12; G11B 20/10009; G11B 20/1403; G11B 7/00745; G11B 20/1037; G11B 2220/185
USPC ............ 369/47.1, 275.2, 275.3, 47.27, 47.28, 369/53.22, 93, 94
See application file for complete search history.

(56) References Cited

U.S. PATENT DOCUMENTS 5,535,067 A    7/1996  Rooke
6,181,658 B1 *  1/2001  Van Den Enden et al. 369/59.25
(Continued)

OTHER PUBLICATIONS

Written Opinion for International Application No. PCT/SG2012/000436 dated Dec. 14, 2012, pp. 1-3.
(Continued)

*Primary Examiner* — Nabil Hindi

(57) ABSTRACT

According to embodiments of the present invention, a storage medium is provided. The storage medium includes a dedicated servo layer including a plurality of servo tracks, wherein at least one of the plurality of servo tracks includes a modulated address information including an address information being modulated by at least one frequency associated with the at least one of the plurality of servo tracks. According to further embodiments of the present invention, a modulator for a storage medium, a demodulator for a storage medium, a data storage device and a method of processing address information for a data storage device are also provided.

17 Claims, 9 Drawing Sheets

(51) Int. Cl.
*G11B 20/12* (2006.01)
*G11B 27/36* (2006.01)
*H03M 13/11* (2006.01)
*H03M 13/00* (2006.01)
*G11B 20/10* (2006.01)
*G11B 20/18* (2006.01)

(52) U.S. Cl.
CPC ........... *G11B27/36* (2013.01); *H03M 13/1111* (2013.01); *H03M 13/6331* (2013.01); *H03M 13/6343* (2013.01); *G11B 20/1037* (2013.01); *G11B 2020/185* (2013.01); *G11B 2220/2516* (2013.01)

(56) References Cited

U.S. PATENT DOCUMENTS

| | | | |
|---|---|---|---|
| 6,791,920 B1 * | 9/2004 | Ko et al. | 369/47.27 |
| 6,982,127 B2 * | 1/2006 | Kondo et al. | 428/836 |
| 7,085,209 B2 * | 8/2006 | Schep et al. | 369/47.31 |
| 7,221,644 B2 * | 5/2007 | Kobayashi et al. | 369/275.5 |
| 7,715,285 B2 * | 5/2010 | Maegawa | 369/44.13 |
| 2003/0128640 A1 | 7/2003 | Schep et al. | |

OTHER PUBLICATIONS

International Preliminary Report on Patentability for International Application No. PCT/SG2012/000436 dated May 27, 2014, pp. 1-5.

* cited by examiner

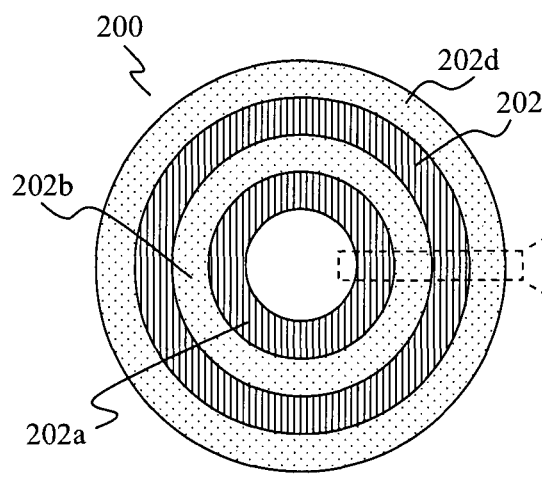
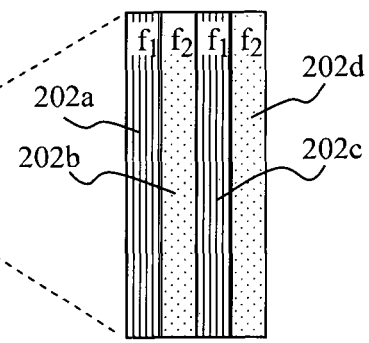
FIG. 2A  FIG. 2B
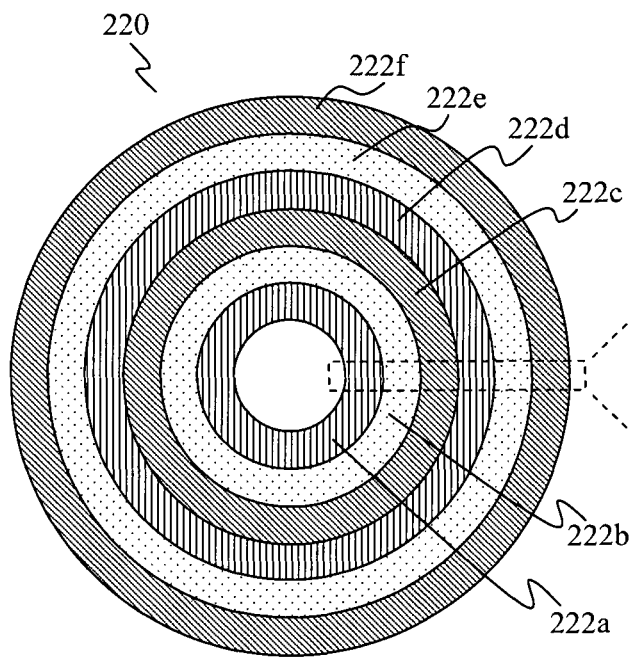
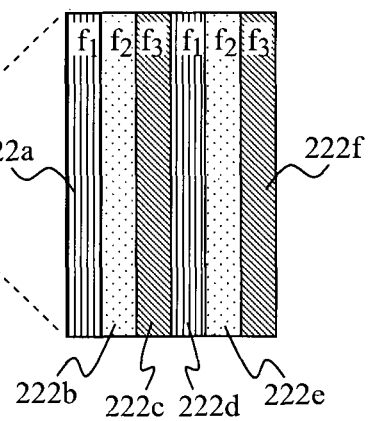
FIG. 2C  FIG. 2D

METHOD OF PROCESSING ADDRESS INFORMATION FOR A DATA STORAGE DEVICE, AND STORAGE MEDIUM, MODULATOR, DEMODULATOR, AND DATA STORAGE DEVICE

CROSS-REFERENCE TO RELATED APPLICATION

This application claims the benefit of priority of Singapore patent application No. 201108620-4, filed 21 Nov. 2011, the content of it being hereby incorporated by reference in its entirety for all purposes.

TECHNICAL FIELD

Various embodiments relate to storage mediums, modulators for storage mediums, demodulators for storage mediums, data storage devices, and methods for processing address information for a data storage device.

BACKGROUND

Electronic devices, including mobile computing and/or communication devices, are becoming smaller thereby driving the weight and size of data storage devices down, while requiring large storage capacity in the terabyte range and low power consumption.

A data storage device, for example hard disk drives (HDDs), employs a servo system for tracking and controlling the movement of the read/write head. The servo system performs two distinct functions known as the "seek" or "access" function and the "track following" function.

Conventional servo systems employ embedded servo where the servo information runs radially from the inner diameter (ID) to the outer diameter (OD) of the disc in a series of "servo wedges" interspersed with data. Therefore, the servo information is only detected when the read/write head moves over these servo wedges. In between the servo wedges, no servo information is received by the head. Servo information includes indexing information, for example, Sector Address Marks (SAM) and Gray codes are encoded within (and occupy the space in) the servo wedges of the embedded servo. In addition, conventional servo systems typically employs ABCD servo-burst-signal pattern.

Data storage devices also employ dedicated servo where the servo information is provided on a (servo) layer distinct from the data recording layer. The indexing information is difficult to store in the servo layer as noise from the recording channel corrupts this information.

SUMMARY

According to an embodiment, a storage medium is provided. The storage medium may include a dedicated servo layer including a plurality of servo tracks, wherein at least one of the plurality of servo tracks includes a modulated address information including an address information being modulated by at least one frequency associated with the at least one of the plurality of servo tracks.

According to an embodiment, a modulator for a storage medium is provided. The modulator may include a modulating determiner configured to determine at least one frequency associated with at least one of a plurality of servo tracks of a dedicated servo layer of the storage medium; a modulating circuit configured to modulate an address information using the at least one frequency; and a storing circuit configured to store the modulated address information in the dedicated servo layer.

According to an embodiment, a demodulator for a storage medium is provided. The demodulator may include a retrieving circuit configured to retrieve a modulated address information stored in a dedicated servo layer of the storage medium; a demodulating determiner configured to determine at least one frequency associated with at least one of a plurality of servo tracks of the storage medium; and a demodulating circuit configured to demodulate the modulated address information using the at least one frequency.

According to an embodiment, a data storage device is provided. The data storage device may include a storage medium according to an embodiment.

According to an embodiment, a method of processing address information for a data storage device is provided. The method may include providing a dedicated servo layer of a storage medium of the data storage device; and storing a modulated address information in the dedicated servo layer, wherein the dedicated servo layer has a plurality of servo tracks; and wherein the modulated address information includes an address information being modulated by at least one frequency associated with at least one of the plurality of servo tracks.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 2A shows a schematic top view of a portion of a servo layer, according to various embodiments.

FIG. 2B shows a schematic top view of a section of the servo layer of the embodiment of FIG. 2A.

FIG. 2C shows a schematic top view of a portion of a servo layer, according to various embodiments.

FIG. 2D shows a schematic top view of a section of the servo layer of the embodiment of FIG. 2C.

DETAILED DESCRIPTION

Figure 1:
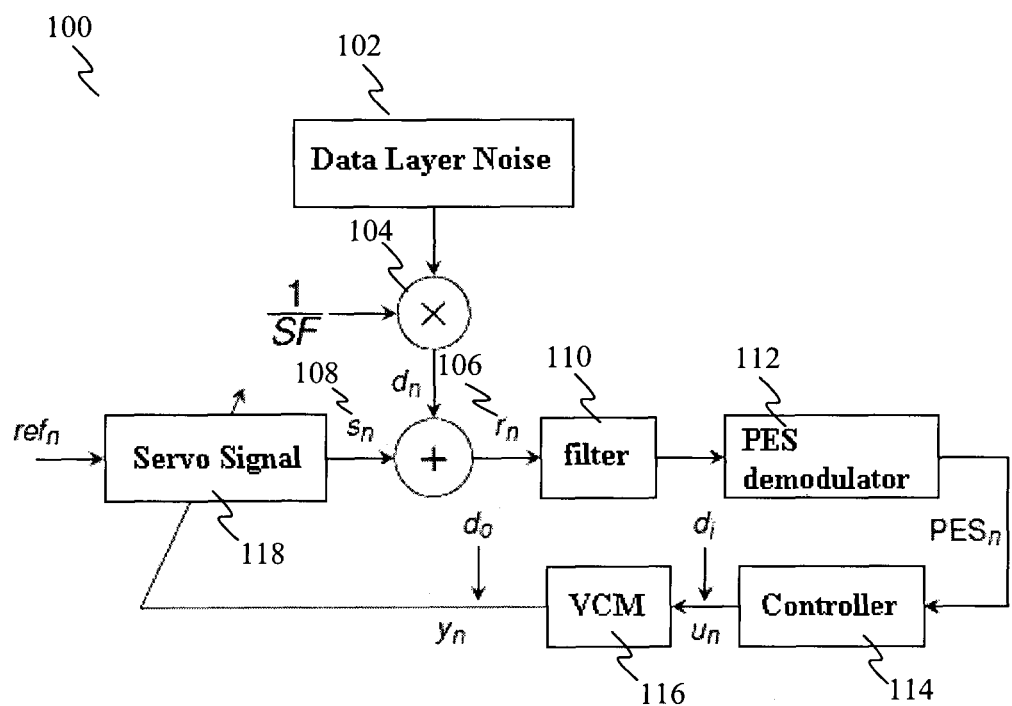
FIG. 1 shows a block diagram of a servo control system of a hard disk drive, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of a method are analogously valid for a device, and vice versa.

In the context of various embodiments, the articles "a", "an" and "the" as used with regard to a feature or element includes a reference to one or more of the features or elements.

As used herein, the term "and/or" includes any and all combinations of one or more of the associated listed items.

Various embodiments relate to a data storage device having a dedicated servo (DS) using dual frequency servo (DFS) scheme. The data storage device may include a memory which is for example used in the processing carried out by the data storage device. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

Various embodiments may provide a scheme for encoding Sector Address Marks (SAM) and Gray code in the DFS system. The SAM and Gray code (or interchangably referred to as the Gray information) are indexing counters that address each sector/track on the platter. The SAM and Gray code relate to servo information and it may be more efficient to have these information stored in the dedicted servo layer than a data recording layer of the DS system so as to increase the data recording capacity of the data recording layer for user data (as an example). Encoding SAM and Gray code in the DFS system also provides the advantage of repeated or redundant copies of SAM and Gray code multiple times for each sector which substantially reduces the error probability in decoding them. A DFS system provides much higher PES sampling rate and higher servo bandwidth which can lead to more accurate servo tracking precision as compared to conventional servo systems, for example, employing embedded servo.

Various embodiments may provide a method for encoding the SAM and Gray indexing information into the two frequencies that are simultaneously being used for position computation.

Various embodiments may provide a magnetic recording system (or interchangeably referred to as a data storage device) having a dedicated servo layer in recording medium. The Sector Address Mark (SAM) and Gray bits may be stored in the dedicated servo layer. Frequency shift keying (FSK) may be used to store the SAM and Gray bits.

Various embodiments may provide a magnetic recording system having a dedicated servo layer in recording medium. The Sector Address Mark (SAM) and Gray bits may be stored in the dedicated servo layer. Phase shift keying (PSK) may be used to store the SAM and Gray bits.

In general, a head-positioning servo mechanism is provided in a data storage device, e.g. a hard disk drive (HDD), which acts as a control system. The control system may position the head (e.g. read/write (R/W) head) which is mounted on an actuator over a desired data track of a storage medium and reposition the head from one data track to another.

In a HDD servo control system, the position of the head relative to the center of the desired data track, and therefore the position error signal (PES), may be sensed and used by the servo system to generate the appropriate commands to the actuator, which in turn moves the head in an effort to reduce the position error.

For example, FIG. 1 shows a schematic block diagram of a servo control system 100, according to various embodiments.

Data layer noise 102 is superimposed to servo signal $s_n$ through gain control module 104 where the effective amplitude of data layer signal is increased by 1/SF (scaling factor SF<1) due to the data layer being closer to the read head than the servo layer. The combined servo and data layer signal, $r_n$ 106, is provided to a filter 110 which passes the servo signal, $s_n$ 108, while removing most of the data layer signal. The output from the filter 110 is then provided to a PES demodulator 112 to perform extraction or demodulation in order to provide the position error signal (PES), $PES_n$. Subsequently, a controller 114 receives the PES, and then outputs a signal, $u_n$, which together with a predefined or measured input disturbance profile, $d_i$, are provided to a voice coil motor (VCM) 116. The VCM 116 may drive an actuator which controls movement and positioning of a head (e.g. read/write head) in a data storage device. The output, $y_n$, of the VCM 116 together with any mechanical vibration profile such as caused by windage and NRRO, $d_o$, determine the head position relative to the track center, which in turn reads the servo signal 118 and data layer signal 102. The reference signal $ref_n$ is the reference head position that the servo loop is attempting to follow and could be due to low frequency drift in the head position, or shock and vibe. The readback signal which contains servo signal 118 and data layer noise 102, the filter 110, the PES demodulator 112, the controller 114 and the VCM 116 form a the servo control feedback loop.

PES is a signal proportional to the difference of the positions of the centre of the head and the nearest track centre. Therefore, the PES may provide an indication of the position of the head relative to the storage medium, for example the position of the head relative to a data track, and whether the head is positioned at the centre of the data track (on track) or shifted relative to the centre of the data track (off track) and the magnitude of the shift, such that the position of the head may then be adjusted.

In a dedicated servo implementation, one disk surface (servo layer) is dedicated to store the position data referred to as servo data or servo signal or servo information. The servo layer may be a buried layer arranged beneath the data recording layer (or may also be referred to as the data layer or the recording layer). Further, the servo layer and data recording layer may be put or arranged on the same side and they may be read and/or processed together; this may also be referred to as dedicated servo. In various embodiments, there may be multiple (e.g. at least two) layers of magnetic media on a single surface, where one layer is dedicated to servo and another layer dedicated to data. The data layer may be arranged above the servo layer, thereby being closer to the head than the servo layer. In contrast, conventionally, one surface of the magnetic media is dedicated to hold the servo, with no data being stored on this surface. In the context of various embodiments, the servo layer and the data recording layer are separate layers or distinct layers where the signals from the servo layer and the data layer may be read together at the same time. The signals from the servo layer and the data layer may be read by a single head. The servo layer may have a perpendicular or a longitudinal magnetization orientation for providing magnetic information for determining the location of the head in relation to the storage medium. The servo information is provided on the servo layer distinct from the data recording layer so as to allow continuously available servo readback to enable continuous or continual position error information thereby providing continual servo control without utilizing any of the recording layers for location detection. The dedicated servo may provide higher positioning accuracy through continual location determination, while also removing the servo sectors/tracks from the data recording layer, thereby increasing surface utilization of the storage space in the data recording layer and further increasing the data recording density by increasing the track positioning accuracy.

The dedicated servo layer may have a continuous track structure having a plurality of servo tracks in a concentric arrangement. Each servo track may be assigned an identical frequency signal. In another example, adjacent servo tracks may be alternately assigned different frequency signals, having respective frequencies $f_1$ and $f_2$, as illustrated in FIGS. 2A and 2B for a portion of the servo layer 200 towards its inner diameter, showing four servo tracks 202a, 202b, 202c, 202d. In this configuration, the head of the data storage device may be positioned in between two adjacent tracks (e.g. 202a and 202b; 202b and 202c), for example at the boundary of the two adjacent tracks, and may be able to obtain a readback servo signal having frequencies $f_1$ and $f_2$.

In a further example, adjacent servo tracks may be alternately assigned different frequency signals, having respective frequencies $f_1$, $f_2$ and $f_3$, as illustrated in FIGS. 2C and ID for a portion of the servo layer 220 towards its inner diameter, showing six servo tracks 222a, 222b, 222c, 222d, 222e, 222f. In an embodiment, the head may be positioned in between two adjacent tracks (e.g. 222a and 222b; 222c and 222d), for example at the boundary of the two adjacent tracks, and may be able to obtain a readback servo signal having two different frequencies (e.g. $f_1$ and $f_2$; $f_3$ and $f_1$). In another embodiment, the head may detect up to three adjacent tracks (e.g. 222a, 222b and 222c; 222c, 222d and 222e) of signals from the servo layer. The head may be centered over one track, where signals from the adjacent tracks on either side may also be received by the head to obtain a readback servo signal having three different frequencies (e.g. $f_1$, $f_2$ and $f_3$), while signals from tracks further removed may not be received by the head.

Therefore, in various embodiments of a dedicated servo system, each servo track has a single frequency. The position error signal (PES) may be produced from the frequency based servo signal, including dual/triple frequency based signals. Using the dual frequency based servo signal as an example, during track following, the center of the head may be positioned at the middle of two adjacent servo tracks, whereby the head picks up a readback servo signal having two frequencies from the two adjacent servo tracks at the same time. In various embodiments, apart from providing the PES, the frequency based servo signal may also be used to carry information (bits) that holds the SAM and Gray codes by using the frequency based servo signal as carrier frequencies.

In order that the invention may be readily understood and put into practical effect, particular embodiments will now be described by way of examples and not limitations, and with reference to the figures.

Figure 3A:
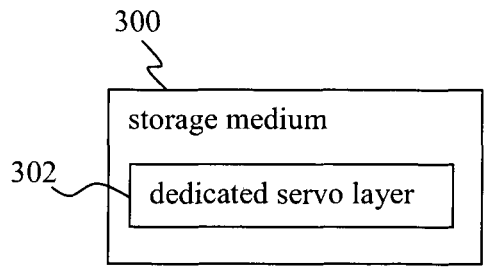
FIG. 3A shows a schematic block diagram of a storage medium, according to various embodiments.

FIG. 3A shows a schematic block diagram of a storage medium 300, according to various embodiments. The storage medium 300 includes a dedicated servo layer 302 configured to store a modulated address information, wherein the dedicated servo layer 302 has a plurality of servo tracks; and wherein the modulated address information includes an address information being modulated by at least one frequency associated with at least one of the plurality of servo tracks.

In the context of various embodiments, the term "associated with" may refer to being derived from or being assigned to. The at least one frequency associated with at least one of the plurality of servo tracks may be a single tone frequency of a readback servo signal, which is a signal read from a track of the dedicated servo layer (for example, the dedicated servo layer 302). The readback servo signal refers to a signal without carrying any bit information. The readback servo signal may have a first frequency (e.g. $f_1$) associated with a first servo track and a second frequency (e.g. $f_2$) associated with a second servo track adjacent to the first servo track.

For example, the readback servo signal may be include two sinusoids. Each sinusoid has three information bearing properties, namely the amplitude, the phase and the frequency.

The readback servo signal may be obtained or extracted from the dedicated servo layer 302 of the storage medium 300, which is separate from the data recording layer of the storage medium 300. The servo layer 302 is arranged below the data recording layer, with the data recording layer being proximal to the head and the servo layer 302 being distal to the head. The servo layer 302 provides servo information or positioning signals for servo control.

The servo layer 302 may include a plurality of concentric tracks for holding the servo information. Each servo track may be assigned or associated with a single frequency signal (i.e., the readback servo signal). Adjacent servo tracks may be assigned different frequencies. Repeated servo tracks may be assigned alternate frequencies. In the context of various embodiments, adjacent servo tracks mean tracks that are arranged side-by-side. In various embodiments, two adjacent servo tracks share a common boundary.

In the context of various embodiments, the term "storage medium" may refer to a disk or platter of a data storage device, for example, a hard disk drive (HDD).

A head is positioned over a storage medium (for example, the storage medium 300 of FIG. 3) and the reader may read signal or information from the storage medium and the writer may write information to the storage medium. As used herein, the head may include a magnetic head. In addition, the head may refer to the read/write head for reading/writing information or data from/to a storage medium. The head includes a reader and a writer.

In various embodiments, the address information may include at least one of track address information that addresses a track of the storage medium 300 or sector address information that addresses a sector of the storage medium 300. For example, the address information may be the track address information, or the sector address information, or both. The address information may be a Sector Address Mark (SAM) or a Gray code.

In various embodiments, the at least one frequency associated with the at least one of the plurality of servo tracks may include a frequency of a signal, the signal being configured to be used in estimating a position error signal. For example, the signal may be the readback servo signal as described above.

Figure 3B:
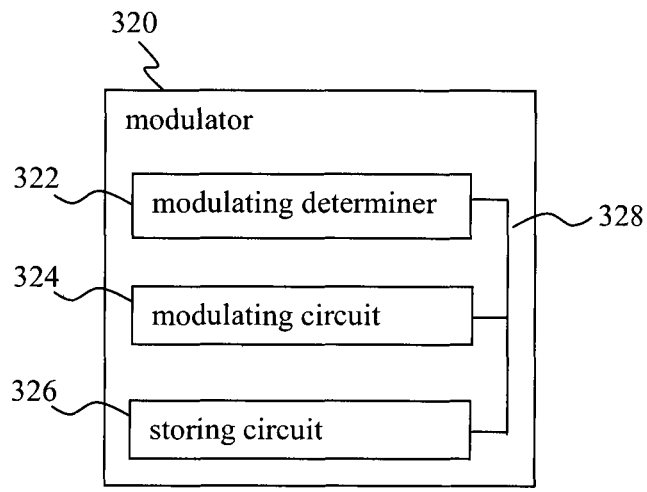
FIG. 3B shows a schematic block diagram of a modulator for a storage medium, according to various embodiments.

FIG. 3B shows a schematic block diagram of a modulator for a storage medium, according to various embodiments. The modulator 320 may include a modulating determiner 322 configured to determine at least one frequency associated with at least one of a plurality of servo tracks of a dedicated servo layer of the storage medium; a modulating circuit 324 configured to modulate an address information using the at least one frequency; and a storing circuit 326 configured to store the modulated address information in the dedicated servo layer. In FIG. 3B, the line represented as 328 is illustrated to show the relationship between the modulating determiner 322, the modulating circuit 324, and the storing circuit 326, which may include electrical coupling and/or mechanical coupling.

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

The term "store" may refer to writing in a signal into the servo track.

The terms "associating", "dedicated servo layer" and "storage medium" may be defined as above.

For example, the storage medium and the dedicated servo layer may be a storage medium 300 and the dedicated servo layer 302 of FIG. 3A.

As similarly described above, the address information may include at least one of track address information that addresses a track of the storage medium or sector address information that addresses a sector of the storage medium. The address information may be a Sector Address Mark or a Gray code. The at least one frequency associated with the at least one of the plurality of servo tracks may be a frequency of a signal, the signal being configured to be used in estimating a position error signal. For example, the signal may be the readback servo signal as described above.

In various embodiments, the modulating circuit 324 may be configured to modulate the address information using a first frequency associated with one of the plurality of servo tracks of the storage medium and a second frequency of associated with another one of the plurality of servo tracks of the storage medium.

In an example, the modulating circuit 324 may be configured to modulate the track address information using the first frequency of associated with one of the plurality of servo tracks of the storage medium, and to modulate the sector address information using the second frequency associated with one of the plurality of servo tracks of the storage medium.

In some embodiments, the modulator 320 may be a frequency shift keying (FSK) modulator. Generally, FSK is a frequency modulation scheme in which digital information is transmitted through discrete frequency changes of a carrier wave (or in this case, the readback servo signal). The simplest FSK is binary FSK (BFSK). BFSK uses a pair of discrete frequencies to transmit binary (0s and 1s) information. With this scheme, the "1" is called the mark frequency and the "0" is called the space frequency.

In other embodiments, the modulator 320 may be a phase shift keying (PSK) modulator. PSK is a digital modulation scheme that conveys data by changing, or modulating, the phase of a reference signal (i.e., the carrier wave or in this case, the readback servo signal).

Figure 3C:
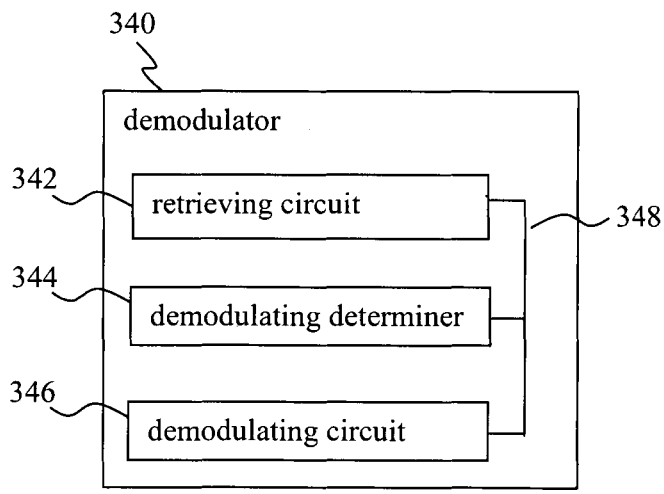
FIG. 3C shows a schematic block diagram of a demodulator for a storage medium, according to various embodiments.

FIG. 3C shows a schematic block diagram of a demodulator for a storage medium, according to various embodiments. The demodulator 340 may include a retrieving circuit 342 configured to retrieve a modulated address information stored in a dedicated servo layer of the storage medium; a demodulating determiner 344 configured to determine at least one frequency associated with at least one of a plurality of servo tracks of the storage medium; and a demodulating circuit 346 configured to demodulate the modulated address information using the at least one frequency. In FIG. 3C, the line represented as 348 is illustrated to show the relationship between the retrieving circuit 342, the demodulating determiner 344, and the demodulating circuit 346, which may include electrical coupling and/or mechanical coupling.

The term "retrieve" may refer to reading out a stored signal from the servo track. The phrase "stored in the dedicated servo layer" may mean stored in at least one servo track of the dedicated servo layer.

The terms "associating", "dedicated servo layer", "storage medium" and "circuit" may be defined as above.

For example, the storage medium and the dedicated servo layer may be a storage medium 300 and the dedicated servo layer 302 of FIG. 3A.

As similarly described above, the address information may include at least one of track address information that addresses a track of the storage medium or sector address information that addresses a sector of the storage medium. The address information may be a Sector Address Mark or a Gray code.

In various embodiments, the demodulating circuit 346 may be configured to demodulate the modulated address information using a first frequency associated with one of the plurality of servo tracks of the storage medium and a second frequency of associated with another one of the plurality of servo tracks of the storage medium.

In an example, the demodulating circuit 346 may be configured to demodulate the track address information using the first frequency of associated with one of the plurality of servo tracks of the storage medium, and to demodulate the sector address information using the second frequency associated with one of the plurality of servo tracks of the storage medium.

In one embodiment, the at least one frequency associated with the at least one of the plurality of servo tracks may be a frequency of a signal, the signal being configured to be used in estimating a position error signal. For example, the demodulator 340 may be a position error signal demodulator.

For example, the signal may be the readback servo signal as described above.

Figure 3D:
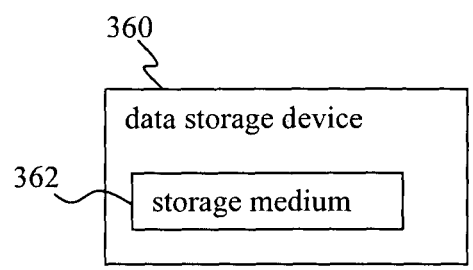
FIG. 3D shows a schematic block diagram of a data storage device, according to various embodiments.

FIG. 3D shows a schematic block diagram of a data storage device 360, according to various embodiments. The data storage device 360 may include a storage medium 362 in accordance to various embodiments. For example, the storage medium 362 may be the storage medium 300.

In various embodiments, the data storage device 360 may further include a modulator including a modulating determiner configured to determine the at least one frequency associated with the at least one of a plurality of servo tracks of the dedicated servo layer of the storage medium; a modulating circuit configured to modulate the address information using the at least one frequency; and a storing circuit configured to store the modulated address information in the dedicated servo layer. For example, the modulator may be the modulator 320.

In various embodiments, the data storage device 360 may further include a demodulator including a retrieving circuit configured to retrieve the modulated address information stored in the dedicated servo layer of the storage medium; a demodulating determiner configured to determine the at least one frequency associated with the at least one of a plurality of servo tracks of the storage medium; and a demodulating circuit configured to demodulate the modulated address information using the at least one frequency. For example, the demodulator may be the demodulator 340.

In an example, both SAM and Gray code may be modulated (or encoded) using only one of the frequencies, each being associated with one of the plurality of servo tracks of the storage medium. However, the servo bursts from which the position error signal (PES) is derived need to be written with dual or more frequencies for different tracks. In such circumstances, a section of the servo signal containing SAM and Gray code is separated from another section of the servo signal containing the PES.

In another example, both SAM and Gray code may be modulated (or encoded) using at least two frequencies. This allows the SAM and Gray code as well as the PES to be available from the same servo section.

Figure 3E:
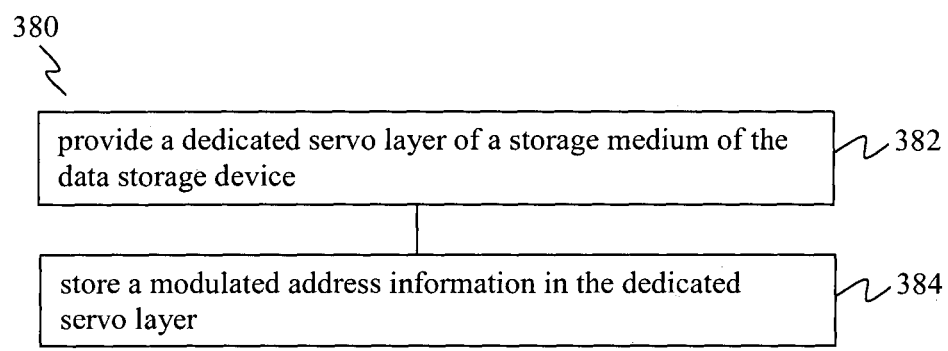
FIG. 3E shows a flow chart illustrating a method for processing addressing information for a data storage device, according to various embodiments.

FIG. 3E shows a flow chart 380 illustrating a method for processing address information for a data storage device, according to various embodiments.

At 382, a dedicated servo layer of a storage medium of the data storage device may be provided. At 384, a modulated address information is stored in the dedicated servo layer.

The dedicated servo layer may have a plurality of servo tracks; and the modulated address information may include an address information being modulated by at least one frequency associated with at least one of the plurality of servo tracks.

The terms "associating", "dedicated servo layer", "storage medium" and may be defined as above.

For example, the storage medium and the dedicated servo layer may be a storage medium 300 and the dedicated servo layer 302 of FIG. 3A.

As similarly described above, the address information may include at least one of track address information that addresses a track of the storage medium or sector address information that addresses a sector of the storage medium. The address information may be a Sector Address Mark or a Gray code.

In various embodiments, the method 380 may further include determining the at least one frequency associated with the at least one of a plurality of servo tracks of the storage medium; and modulating the address information using the at least one frequency.

The address information being modulated by the at least one frequency associated with the at least one of the plurality of servo tracks (as described above) is provided by modulating the address information using the at least one frequency.

In an embodiment, modulating the address information using the at least one frequency may include modulating the address information using a first frequency associated with one of the plurality of servo tracks of the storage medium and a second frequency of associated with another one of the plurality of servo tracks of the storage medium.

In an example, modulating the address information using the at least one frequency may include modulating the track address information using the first frequency (e.g., $f_1$) of associated with one of the plurality of servo tracks of the storage medium, and modulating the sector address information using the second frequency (e.g., $f_2$) associated with one of the plurality of servo tracks of the storage medium.

In one embodiment, modulating the address information may include modulating the address information using frequency shift keying (FSK).

In another embodiment, modulating the address information may include modulating the address information using phase shift keying (PSK).

In various embodiments, the Method 380 may further include determining using the at least one frequency the modulated address information stored in the dedicated servo layer of the storage medium.

In one embodiment, determining using the at least one frequency the modulated address information may include demodulating the modulated address information using the first frequency (e.g., $f_1$) and the second frequency (e.g., $f_2$).

Various embodiments may provide a data storage device (e.g. the data storage device 360 of FIG. 3D) and a method for encoding the SAM and Gray code using Frequency and/or Phase Shift Keying.

Phase shift keying (PSK) and frequency shift keying (FSK) are two methods of transmitting digital information over a carrier frequency that is frequently used in communications. In typical communication usage, the carrier frequency's purpose is to shift the frequency at which the transmission occurs up into a frequency band that is well supported by the transmitting medium (air, in the case of wireless communication). In the context of DFS, the carrier frequencies have the additional role of being used to determine cross-track position via the generation of the PES signal as well.

Figure 4:
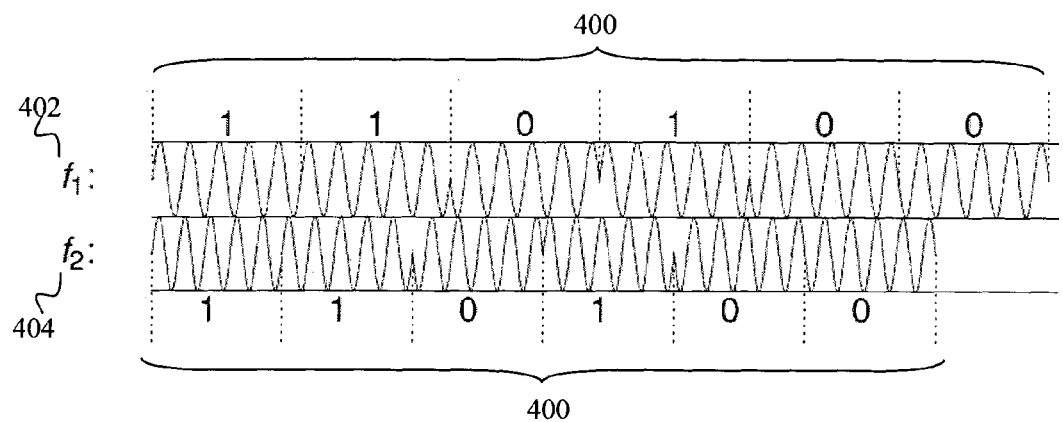
FIG. 4 shows an example of encoding the address information using PSK, according to various embodiments.

FIG. 4 shows an example of encoding the SAM and Gray code using PSK in two frequencies $f_1$ and $f_2$. In FIG. 4 the SAM and Gray code may, for example, be a bitstream or a bit pattern 400 of "110100". The frequencies $f_1$ 402 and $f_2$ 404 are different frequencies. At each "1", the signal is in phase 0° while at each "0", the signal is in phase 180°.

Figure 5:
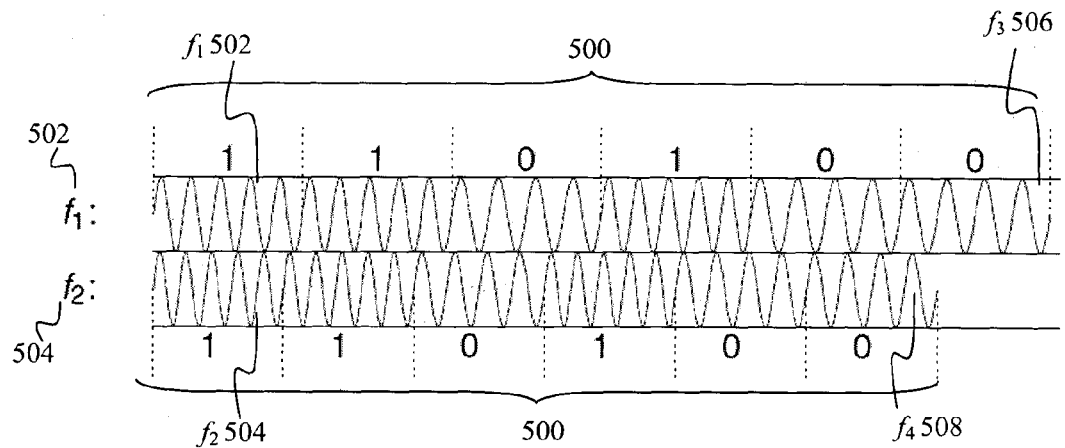
FIG. 5 shows an example of encoding the address information using FSK, according to various embodiments.

FIG. 5 shows an example of encoding the SAM and Gray code using FSK in two frequencies $f_1$ and $f_2$. In FIG. 5 (similar to the example of FIG. 4), the SAM and Gray code may, for example, be a bitstream or a bit pattern 500 of "110100". The frequencies $f_1$ 502 and $f_2$ 504 are different frequencies. For $f_1$ 502, at each mark frequency ("1"), the signal is of $f_1$ 502 while at each space frequency ("0"), the signal is $f_3$ 506, which is of a different frequency to $f_1$ 502. For $f_2$ 504, at each mark frequency ("1"), the signal is of $f_2$ 504 while at each space frequency ("0"), the signal is $f_4$ 508, which is of a different frequency to $f_2$ 504.

To allow the demodulator to also determine the PES from the modulated signal, $f_1$ 502, $f_2$ 504, $f_3$ 506, and $f_4$ 508 are different frequencies from one another and predetermined.

The SAM and Gray code can subsequently be extracted from the PES demodulator. The demodulator is therefore able to discover the position of the head on the platter from the sector and track indexing information (i.e., SAM and Gray code), as well as from the PES itself (i.e., from the amplitude of the readback servo signal). The sector and track indices provide coarse positioning information (location to the nearest sector and track) while the PES provides fine positioning information, (how far off-track the head is located).

Figure 6A:
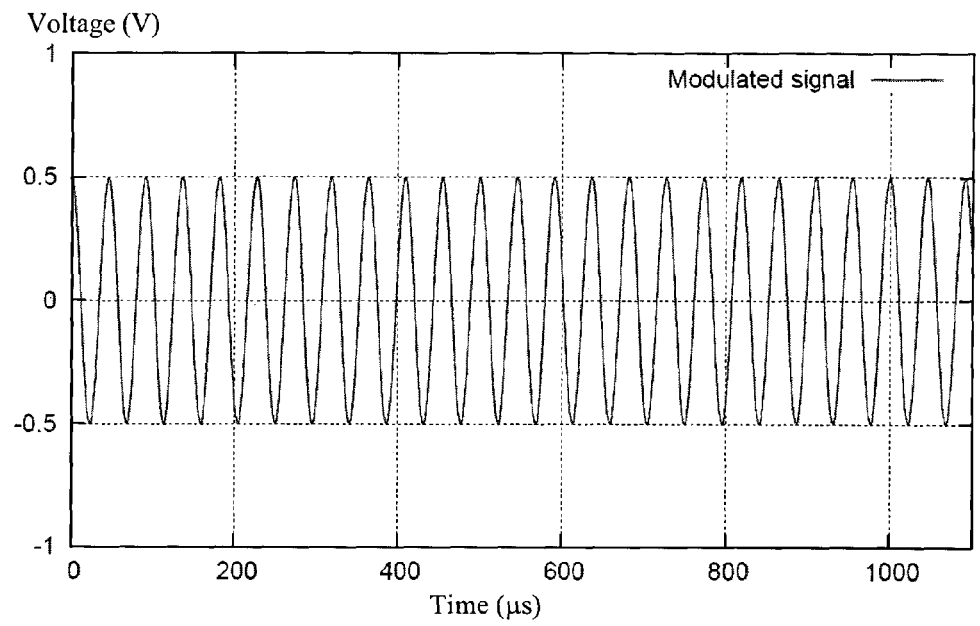
FIGS. 6A and 6B respectively show the time domain and the frequency domain signals without modulation, according to various embodiments.
Figure 6B:
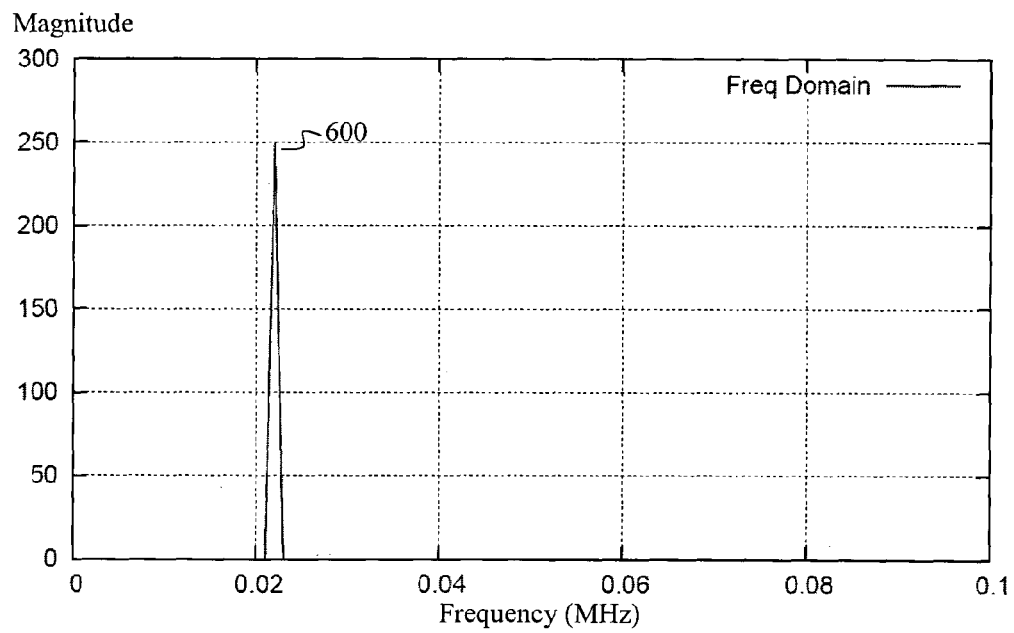
Figure 6C:
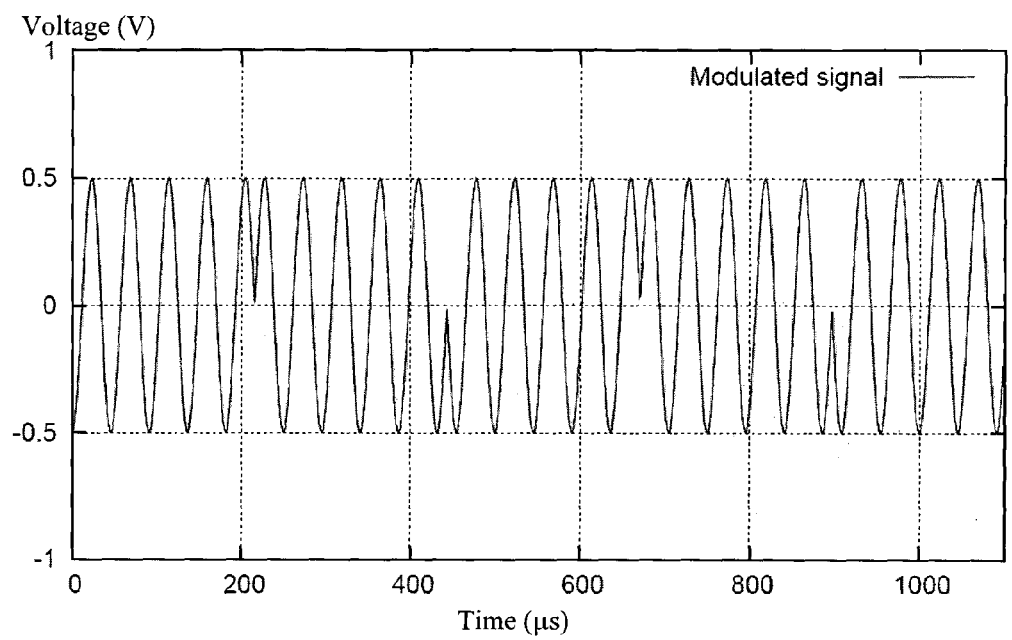
FIGS. 6C and 6D respectively show the time domain and the frequency domain signals modulated with Phase Shift Keying (PSK), according to various embodiments.
Figure 6D:
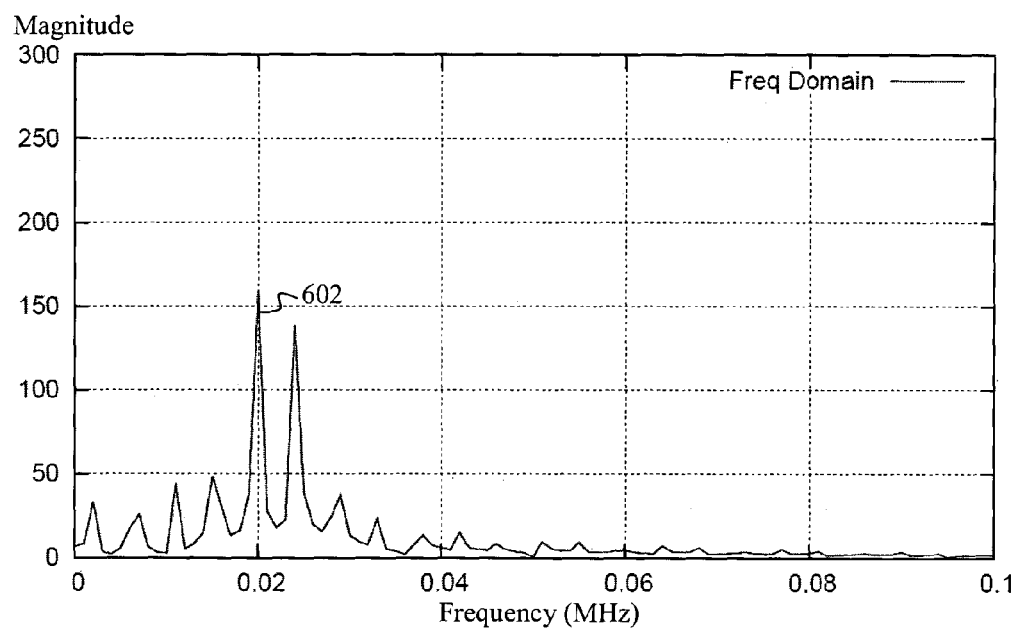
Figure 6E:
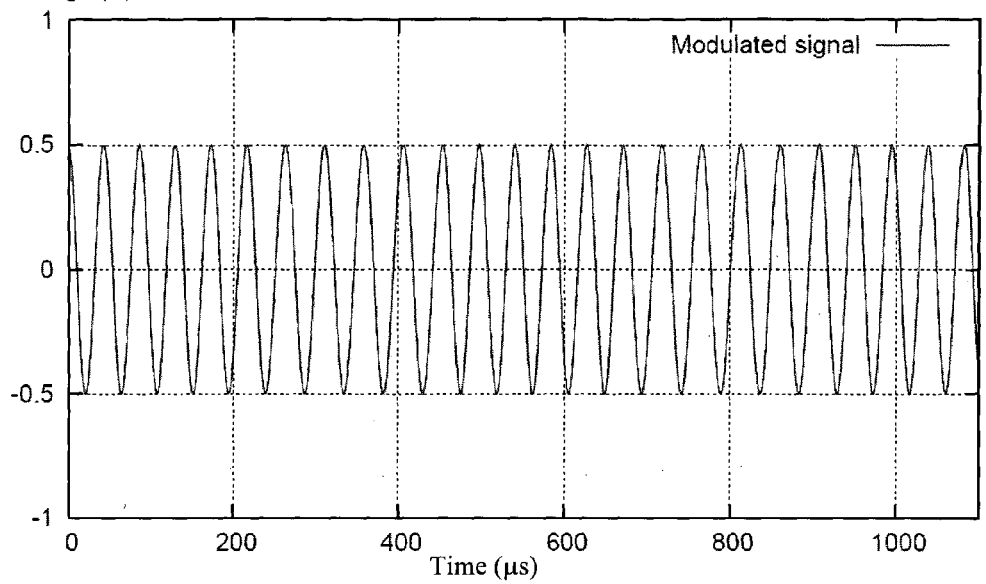
FIGS. 6E and 6F respectively show the time domain and the frequency domain signals modulated with Frequency Shift Keying (FSK), according to various embodiments.
Figure 6F:
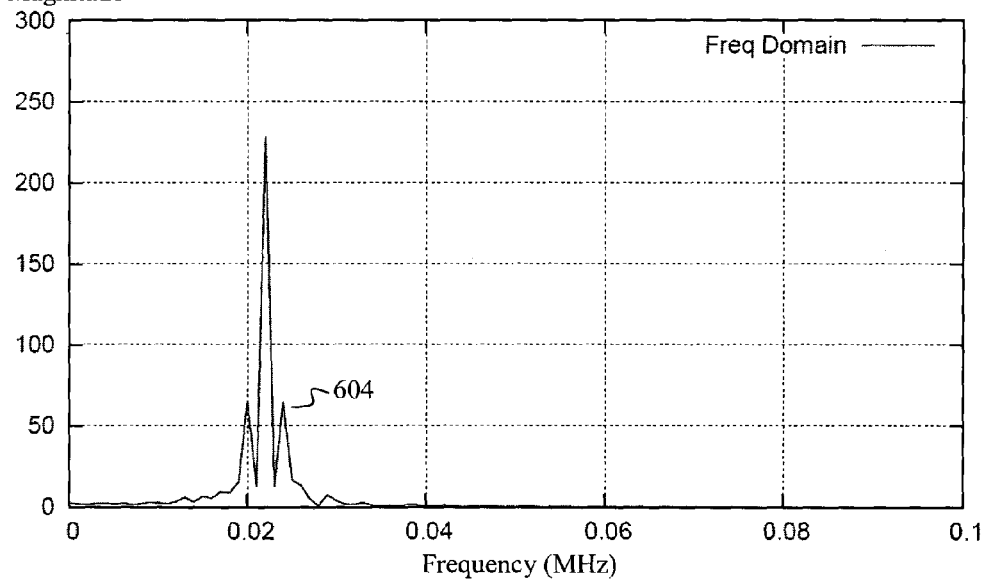
Figure 6G:
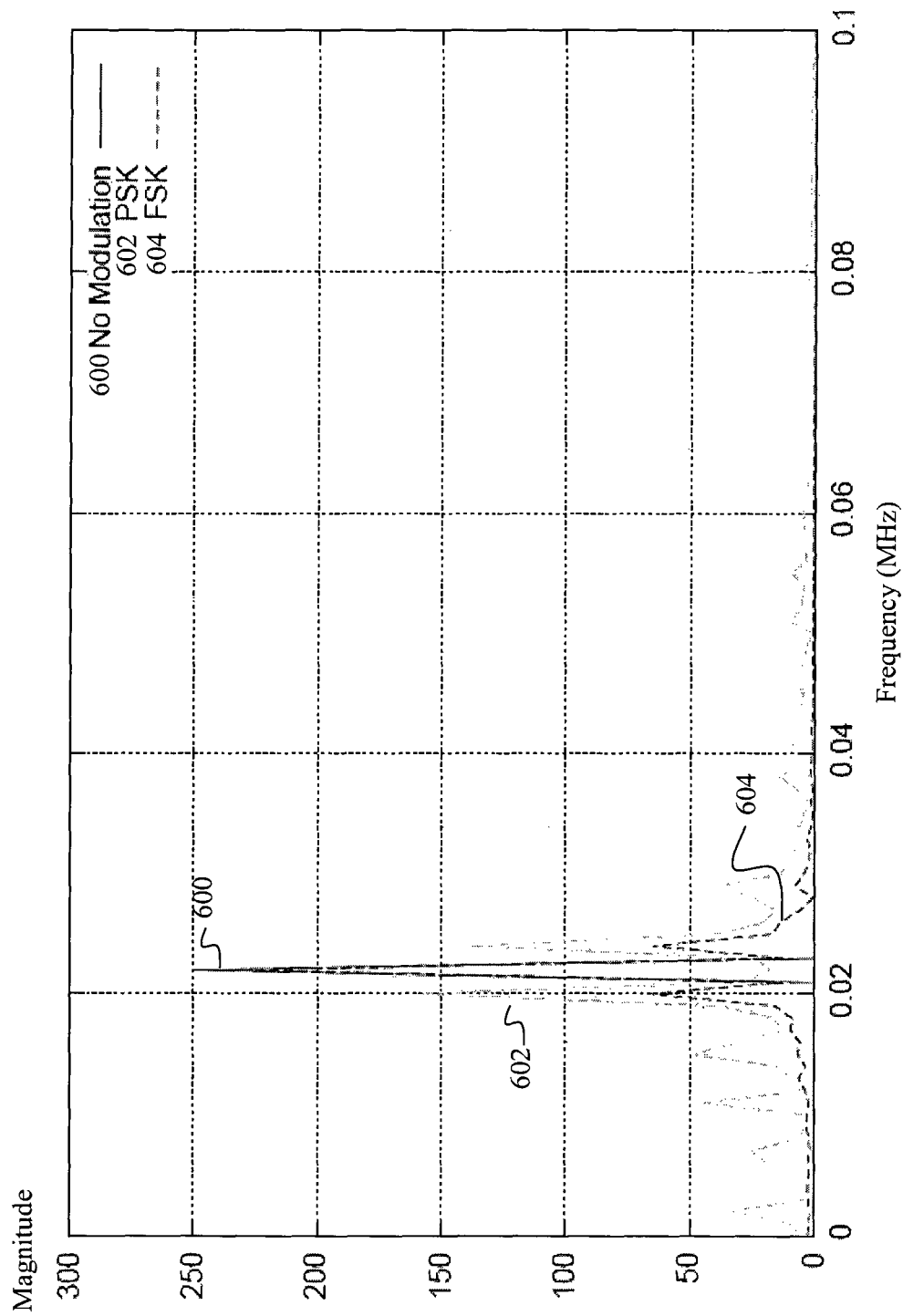
FIG. 6G shows frequency domain signals without modulation, with PSK and with FSK of FIGS. 6B, 6D and 6F, respectively, according to various embodiments.

FIGS. 6A and 6B respectively shows the time domain and the frequency domain signals having a single carrier frequency unmodulated 600. FIGS. 6C and 6D respectively shows the time domain and the frequency domain signals having a single carrier frequency modulated with PSK 602. FIGS. 6E and 6F respectively shows the time domain and the frequency domain signal having a single carrier frequency modulated with FSK 604. FIG. 6G shows a the frequency domain signals having the single carrier frequency unmodulated 600 (as shown in FIG. 6B), and the single carrier frequency modulated with PSK 602 (as shown in FIG. 6D) and the single carrier frequency FSK 604 (as shown in FIG. 6F) independently in a same graph for comparison purposes. It is observed from FIG. 6G that the distortion due to PSK is larger than that due to FSK. Based on this observation, FSK may be better suited for storing the SAM/Gray bits in the DFS system.

As PES is obtained from the amplitude of the readback servo signal, it may be difficult for the amplitude to further carry bit information encoding the SAM and Gray code. Therefore, amplitude shift keying may not be suitable for modulating the SAM and Gray code onto the readback servo signal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A storage medium comprising:
   a dedicated servo layer comprising a plurality of servo tracks,
      wherein at least one of the plurality of servo tracks comprises a modulated address information comprising an address information being modulated by at least one frequency associated with the at least one of the plurality of servo tracks.

2. The storage medium of claim 1,
   wherein the address information comprises at least one of track address information that addresses a track of the storage medium or sector address information that addresses a sector of the storage medium.

3. The storage medium of claim 1, wherein the address information is a Sector Address Mark or a Gray code.

4. The storage medium of claim 1,
   wherein the at least one frequency associated with the at least one of the plurality of servo tracks comprises a frequency of a signal, the signal being configured to be used in estimating a position error signal.

5. A modulator for a storage medium, the modulator comprising:
   a modulating determiner configured to determine at least one frequency associated with at least one of a plurality of servo tracks of a dedicated servo layer of the storage medium;
   a modulating circuit configured to modulate an address information using the at least one frequency; and
   a storing circuit configured to store the modulated address information in the dedicated servo layer.

6. The modulator of claim 5,
   wherein the modulating circuit is configured to modulate the address information using a first frequency associated with one of the plurality of servo tracks of the storage medium and a second frequency of associated with another one of the plurality of servo tracks of the storage medium.

7. The modulator of claim 5,
   wherein the address information comprises at least one of track address information that addresses a track of the storage medium or sector address information that addresses a sector of the storage medium.

8. The modulator of claim 5, wherein the address information is a Sector Address Mark or a Gray code.

9. The modulator of claim 5,
   wherein the at least one frequency associated with the at least one of the plurality of servo tracks comprises a frequency of a signal, the signal being configured to be used in estimating a position error signal.

10. The modulator of claim 5, wherein the modulator is a frequency shift keying modulator.

11. The modulator of claim 5, wherein the modulator is a phase shift keying modulator.

12. A demodulator for a storage medium, the demodulator comprising:
   a retrieving circuit configured to retrieve a modulated address information stored in a dedicated servo layer of the storage medium;
   a demodulating determiner configured to determine at least one frequency associated with at least one of a plurality of servo tracks of the storage medium; and
   a demodulating circuit configured to demodulate the modulated address information using the at least one frequency.

13. The demodulator of claim 12,
   wherein the demodulating circuit is configured to demodulate the modulated address information using a first frequency associated with one of the plurality of servo tracks of the storage medium and a second frequency of associated with another one of the plurality of servo tracks of the storage medium.

14. The demodulator of claim 12,
   wherein the address information comprises at least one of track address information that addresses a track of the storage medium or sector address information that addresses a sector of the storage medium.

15. The demodulator of claim 12, wherein the address information is a Sector Address Mark or a Gray code.

16. The demodulator of claim 12,
   wherein the at least one frequency associated with the at least one of the plurality of servo tracks comprises a frequency of a signal, the signal being configured to be used in estimating a position error signal.

17. The demodulator of claim 12, wherein the demodulator is a position error signal demodulator.

* * * * *